United States Patent
Sugiyama et al.

(10) Patent No.: US 7,945,232 B2
(45) Date of Patent: May 17, 2011

(54) MULTIBAND WIRELESS DEVICE AND SEMICONDUCTOR INTEGRATED CIRCUIT

(75) Inventors: Yoshikazu Sugiyama, Kamakura (JP); Satoshi Adachi, Yokohama (JP); Yusaku Katsube, Yokohama (JP); Masazumi Tone, Yokohama (JP); Taku Takaki, Fujisawa (JP)

(73) Assignee: Hitachi Media Electronics Co., Ltd., Iwate (JP)

( * ) Notice: Subject to any disclaimer, the term of this patent is extended or adjusted under 35 U.S.C. 154(b) by 882 days.

(21) Appl. No.: 11/769,151

(22) Filed: Jun. 27, 2007

(65) Prior Publication Data

US 2008/0119153 A1  May 22, 2008

(30) Foreign Application Priority Data

Nov. 16, 2006  (JP) ................................ 2006-310596

(51) Int. Cl.
*H04B 1/28* (2006.01)

(52) U.S. Cl. ...................... 455/333; 455/115.1; 455/126; 455/127.2

(58) Field of Classification Search .................... 455/333
See application file for complete search history.

(56) References Cited

U.S. PATENT DOCUMENTS

| 6,721,543 | B1 * | 4/2004 | Katsura et al. .................. 455/73 |
| 2005/0287964 | A1 | 12/2005 | Tanaka et al. |
| 2006/0217085 | A1 * | 9/2006 | Eisenstadt et al. ............ 455/126 |
| 2008/0085727 | A1 * | 4/2008 | Kratz ......................... 455/456.5 |

FOREIGN PATENT DOCUMENTS

| JP | 2002-171194 | 6/2002 |
| JP | 2006-013674 | 1/2006 |
| JP | 2006-108734 | 4/2006 |
| JP | 2006-180304 | 7/2006 |

* cited by examiner

*Primary Examiner* — Duc Nguyen
*Assistant Examiner* — Ajibola Akinyemi
(74) *Attorney, Agent, or Firm* — Antonelli, Terry, Stout & Krause, LLP.

(57) ABSTRACT

When switching over from a portable telephone system of 800 MHz band to a UWB communication system of 9 GHz band, depending upon a signal for changing over a high pass filter and a low pass filter, a reactance element, which is determined to be matching with a load Z of the high pass filter, is connected to an output terminal of a transmitting power amplifier. With this, it is possible to achieve a multi-band or multi-mode wireless receiver of using a frequency band from 800 MHz to 10 GHz, without an enlargement of a circuit scale and an increase of costs.

2 Claims, 5 Drawing Sheets

LOAD IMPEDANCE ZLt WHEN TRANSMITTING OF
HPF IN DIPLEXER 11, F=0-9GHz

FIG.3

LOAD IMPEDANCE ZLt WHEN TRANSMITTING OF
HPF IN DIPLEXER 11, F=0-9GHz

FIG.4

LOAD IMPEDANCE ZLr WHEN RECEIVING OF
HPF IN DIPLEXER 11, F=0-9GHz

FIG.5

LOAD IMPEDANCE ZLr WHEN RECEIVING OF
HPF IN DIPLEXER, F=0-9GHz

MULTIBAND WIRELESS DEVICE AND SEMICONDUCTOR INTEGRATED CIRCUIT

BACKGROUND OF THE INVENTION

This invention relates to a compound wireless device of multi-band or multi-mode, for enabling to deal with different wireless systems, with using a plural number of frequency bands, and in particular, it relates to a semiconductor integrated circuit for use in a wireless device of Ultra Wide Band (UWB) method having wide band, such as, 9,504 MHz at the maximum frequency, and also in a multi-band wireless device.

In a wireless local area network (hereinafter, "wireless LAN"), there is proposed a system for frequency hopping between frequency bands at high speed, so as to build up a frequency band of wide band signal with using a multi-carrier method for achieving a high transmitting speed, as well as, for spreading signal spectrum thereof.

In more details, an Ultra Wide Band (hereinafter, "UWB") system is proposed as a 802.15a standard of IEEE of U.S.A., applying an Orthogonal Frequency Division Multiplexing (hereinafter, "OFDM") into the multi-carrier method. Thereafter, this UWB is mimed Multi-band OFDM (hereinafter, "MB-OFDM") by Multi-band OFDM Alliance (hereinafter, "MBOA"), and it is now under studying to be standardized as a standard specification.

The wireless frequency band to be used in this MB-OFDM is a band center frequency step Fstep=528 MHz, and Group 1 has three (3) waves: 3,432 MHz, 3,960 MHz and 4,488 MHz; Group 2 three (3) waves: 4,752 MHz, 5,280 MHz and 5,808 MHz; Group 3 three (3) waves: 6,600 MHz, 7,128 MHz and 7,656 MHz; Group 4 three (3) waves: 8,184 MHz, 8,712 MHz and 9,240 MHz; and Group 5 two (2) waves: 9,768 MHz and 10,296 MHz.

Conventional art of a filter for use of a terminal apparatus, which is to be applied into such kind of high frequency band, is mentioned in Japanese Patent Laying-Open No. 2006-180304 (2006), for example.

In recent years, commercialization is made on a multi-band portable telephone apparatus (i.e., a mobile phone) using a plural number of frequency bands. This kind of telephone apparatus must operate under three (3) or four (4) bands, from 800 MHz band to 2.1 GHz band, and the conventional art of this kind is already mentioned in Japanese Patent Laying-Open No. 2006-108734 (2006), for example.

Also, the conventional art of an IC for transmitting high-frequency waves to be used in such the multi-band portable telephone apparatus is already mentioned in Japanese Patent Laying-Open No. 2006-13674 (2006), for example.

In case when considering compounding of this multi-band portable telephone apparatus to be a multi-mode wireless receiver also being operable with MB-OFDM method, there is a problem that it is impossible to achieve this, but without increasing the circuit scale and/or the cost thereof, comparing to those of the presently existing portable telephone apparatus.

BRIEF SUMMARY OF THE INVENTION

It is desired to achieve a wireless receiver using a frequency band from 800 MHz to 10 GHz, without increasing the circuit scale and/or the cost thereof.

It is desired to achieve a wireless receiver using a frequency band from 800 MHz to 10 GHz, without increasing the circuit scale and/or the cost thereof.

According to the present invention, there is provided a wireless transmitting/receiving apparatus, formed on a printed circuit board, comprising: a high pass filter; a low pass filter; a transmitting power amplifier; a low noise amplifier; a transmitting change-over means, which is connected with said high pass filter, said low pass filter, and said transmitting power amplifier; a receiving change-over means, which is connected with said high pass filter, said low pass filter, and said low noise amplifier; a transmitting wire on said printed circuit board, which connects said transmitting change-over means and an output terminal of said transmitting power amplifier; a resistor or a reactance element, or an element composed thereof, which is connected with the output terminal of said transmitting power amplifier and is able to change an impedance of said transmitting wire; and a switching means for turning ON/OFF of connection between the resistor or the reactance element, or the compose element thereof, and the output terminal of said transmitting power amplifier, responding to a signal for changing over between said high pass filter and said low pass filter.

BRIEF DESCRIPTION OF THE DRAWINGS

Those and other objects, features and advantages of the present invention will become more readily apparent from the following detailed description when taken in conjunction with the accompanying drawings wherein.

DESCRIPTION OF THE PREFERRED EMBODIMENTS

Hereinafter, embodiments according to the present invention will be fully explained by referring to the attached drawings.

Embodiment 1

Figure 1:
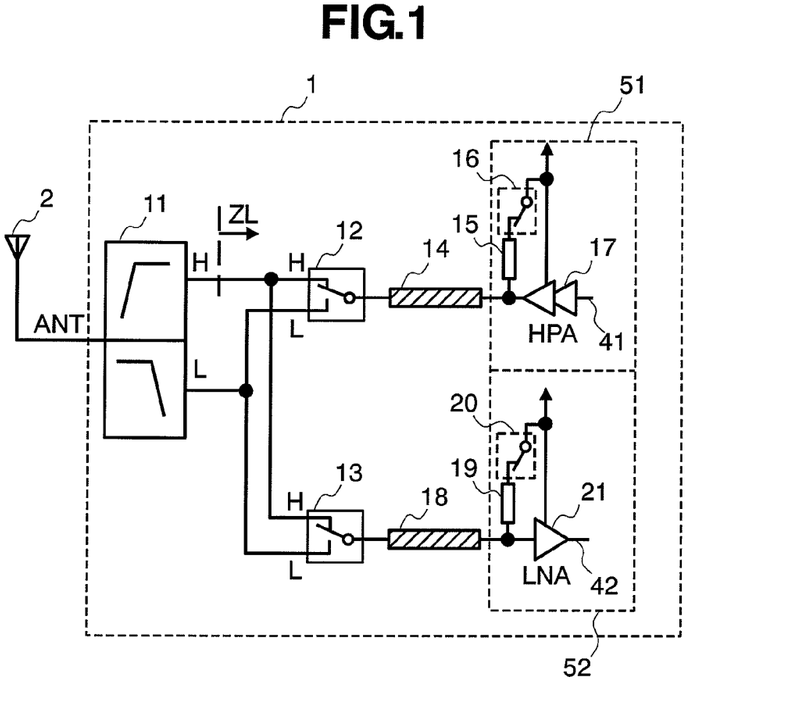
FIG. 1 shows a wireless receiver, according to an embodiment 1 of the present invention.

FIG. 1 shows a multi-mode wireless receiver, being operable with a GSM-type portable telephone system of 800 MHz and a MB-OFDM method UWS system, according to an embodiment 1 of the present invention.

In FIG. 1, a reference numeral 1 depicts a high-frequency transmitting portion, which is built up with a Printed Circuit Board piling up a plural number of dielectric layers or films thereon, 2 an antenna, 11 a dividing filter (or, Diplexer), for letting a signal having frequency of 3,000 MHz or higher than that at an ANT terminal to pass through HPF (High Pass Filter) to a H terminal, while letting a signal of 900 MHz or lower than that to pass through a LPF (Low Pass Filter) to a L terminal, 12 and 13 band change-over switches, 17 a High Power Amplifier (HPA), 14 a wiring on the printed circuit board, for connecting a common terminal of the switch 12 and an output terminal of a HPA 17, 15 a reactance element, which can change an impedance (shown by "ZL" in FIG. 1) of the diplexer 11 when seeing the HPA 17 from the H terminal, 16 a switch to be turned ON/OFF so that the reactance element 15 gives an influence upon an output impedance of the HPA, 21 a Low Noise Amplifier, 18 a wiring on the printed circuit board, for connecting a common terminal of the switch 13 and an output terminal of a LNA 21, 19 is a reactance element, which can change the impedance of the diplexer 11 when seeing the LNA 21 from the L terminal, 20 a switch to be turned ON/OFF so that the reactance element 19 gives an influence upon an output impedance of the LNA, 41 a transmitting signal, and 42 a receiving signal, respectively.

Also, the high power amplifier 17, the reactance element 15, and the switch 16 to be turned ON/OFF, so that the reactance element 15 gives an influence upon the output impedance of the HPA, are constructed on a semiconductor integrated circuit 51, as a unit, while the low noise power amplifier 21, the reactance element 19, and the switch 20 to be turned ON/OFF, so that the reactance element 19 gives an influence upon the output impedance of the LNA, are constructed on a semiconductor integrated circuit 52, as a unit. It is also possible to construct the semiconductor integrated circuit 51 and the semiconductor integrated circuit 52 as a unit.

Herein, various factors of the GSM-type portable telephone system and the MB-OFDM method UWS system are described in the following table 1:

TABLE 1

| Method | GSM Portable Telephone | UWB |
|---|---|---|
| Frequency Band | 800 MHz | 9 GHz |
| Signal Composing Method | FDD | TDD |
| Access Method | TDMA | CSMA |
| Modulation Method | GMSK | MC-OFDM |
| Diffusion Method | Non-Diffusion | Frequency Hopping |

Although explanation will be given on the operation of the multi-mode wireless receiver, by referring to FIG. 1, but first of all, it is assumed that it operates as the GSM-method portable telephone apparatus, and that the frequencies thereof are, for transmitting: 824-849, and for receiving: 869-894 MHz.

The multi-mode wireless receiver changes the band change-over switch 13 to a side of the L terminal, and the impedance switch 20 is cut off so that the reactance element 19 gives no influence onto the input impedance of LNA. In the similar manner, with the reactance element 15 of the HPA 17, the impedance switch 16 is also cut off.

At this instance, for the purpose of receiving a signal from a GSM base station, because of the time division multiplexing, the band switch 12 is changed over to the H-side. The received signal, passing from the ANT terminal of the diplexer 11 to the L terminal and passing from the L terminal of the band switch 13 through the wiring 18, is amplified within the LNA 21.

Not shown in the figure, after receiving, it becomes a base band signal through frequency conversion within a mixer, and it is conducted with GSMK demodulation and data decoding thereon.

When transmitting, by turning the band change-over switch 12 to the L-side while band change-over switch 13 to the H-side, a transmitting output signal of the HPA 17, passing through the wiring 14 and the band change-over switch 12, is outputted from the L terminal of the diplexer 11 to the ANT terminal. In this manner, communication of GSM method is conducted with exchanging between transmitting/receiving.

Next, in case when conducting transmitting/receiving of Group 4 of the UWB system, the frequencies thereof, i.e., the transmitting/receiving center frequencies are: 8,184 MHz, 8,712 MHz and 9,240 MHz.

Within the multi-mode wireless receiver, the impedance switch 20 is conducted so that the reactance element 19 gives an influence upon the input impedance of LNA, and the impedance switch 16 is turned to conductive also on the side of the HPA 17.

And, for enabling to receive the signal of 8 GHz band, the band change-over switch 13 is changed to the H-side, and since the UWB system is of the TDD method, therefore the band change-over switch 12 is changed to the L-side. In this manner, the receiver is changed to receive the signal of 8 GHz band, thereby conducting a carrier sensing.

If it is possible to make transmission, then the change-over switch 12 is changed to the H-side while the band change-over switch 13 to the L-side, thereby outputting the transmitting output signal of the HPA 17, through the wiring 14, from the H terminal of the diplexer 11 to the ANT terminal.

Though not shown in the figure, but a transmitting mixer transmits with exchanging over the carrier frequency, e.g., 8,184 MHz, 8,712 MHz and 9,240 MHz, (i.e., the frequency hopping).

Figure 2:
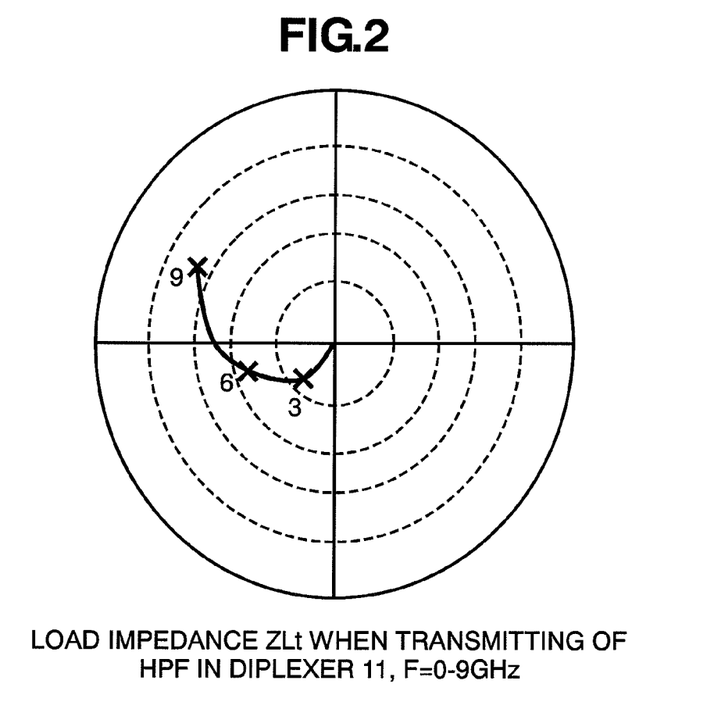
FIG. 2 is a graph for showing load impedance ZLt of HPF of a branching filter when transmitting.

In this manner, the receiver conducts the transmitting/receiving of the GSM method portable telephone and the UWB, but impedance ZLt is shown in FIG. 2, in particular, when seeing the HPA 17 from the H terminal of the diplexer 11.

The conditions of the respect switches are as follows:

| | |
|---|---|
| The band change-over switch 12: | H-side; |
| The band change-over switch 13: | L-side; |
| The impedance switch 16: | Cut off; and |
| The impedance switch 20; | Cut off. |

Up to the frequency 3 GHz, the load impedance of the HPA of the diplexer 11 is matching with, but it comes out as the frequency increases to high, and it is mismatching when the frequency is within a band of the Group 4, e.g., 9 GHz.

This is because the wiring 14 on the printed circuit board 51 can be the transmitting line having characteristic impedance=50Ω up to around 3 GHz, but the characteristic impedance comes off from 50Ω when it is in the high frequency region.

Under such the mismatching condition, the HPA cannot maintain the inherent transmitting characteristic thereof, and thereby generates an increase of an insertion loss, an increase of pass band ripples (within the transmitting band), and also a lowering of depression degree within an outside band (i.e., an out-of band attenuation). Accordingly, the signal of the HPA 17 is attenuated and is transmitted to the ANT 11.

Figure 3:
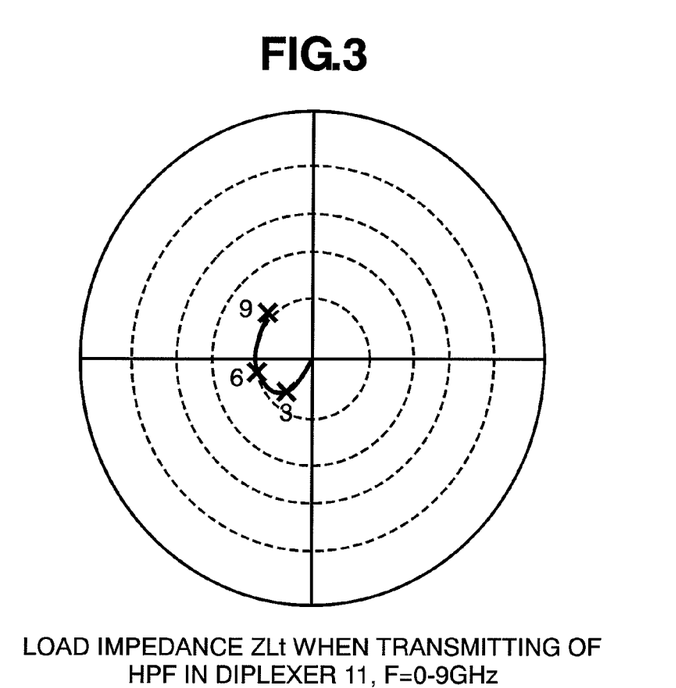
FIG. 3 is a graph for showing improved load impedance ZLt of HPF of the filter when transmitting.

Next, the respect switches are turned into, as follows:

| | |
|---|---|
| The band change-over switch 12: | H-side; |
| The band change-over switch 13: | L-side; |
| The impedance switch 16: | Conductive; and |
| The impedance switch 20; | Conductive. |

In this instance, the reactance element 15 being conductive is so determined that it comes close to 50Ω within the frequency equal to 6 GHz or higher than that, when seeing a sum of the impedance of the wiring 14 and the output impedance of the HPA 17 when turning the reactance element 15 into conductive, from the HPA.

This improved impedance ZLt when seeing the HPA 17 from the H terminal of the diplexer 11 is shown in FIG. 3. The reactance element 15 changes the output impedance of the HPA 17 in the frequency equal to 6 GHz or higher than that, so that the load impedance ZLt, e.g., the sum of the output impedance and the impedance of the wiring 14 come close to 50 Ω.

In this manner, since matching can be made on the load impedance ZLt of the HPA, then the output of the HPA 17 is transmitted to the ANT, without loss thereof.

Figure 4:
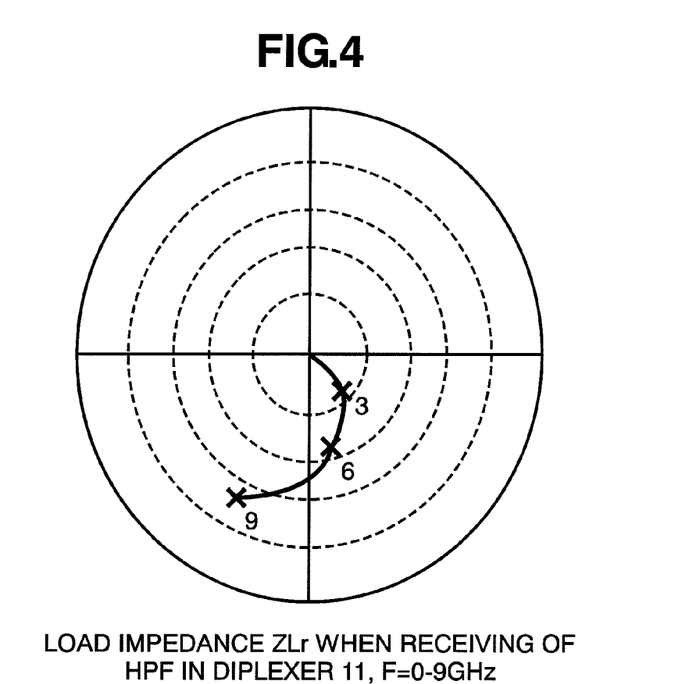
FIG. 4 is a graph for showing load impedance ZLr of HPF of the branching filter when receiving.

The impedance ZLr is shown in FIG. 4, when seeing the HPA 17 from the H terminal of the diplexer 11, in particular, in case of the receiving operation. The respect switches are as follows:

| | |
|---|---|
| The band change-over switch 12: | L-side; |
| The band change-over switch 13: | H-side; |
| The impedance switch 16: | Cut off; and |
| The impedance switch 20; | Cut off. |

In the similar manner to that when transmitting, the load impedance ZLr comes off from 50Ω, in the frequency equal to 6 GHz or higher than that, and the LPF characteristic of the diplexer 11 is deteriorated.

Figure 5:
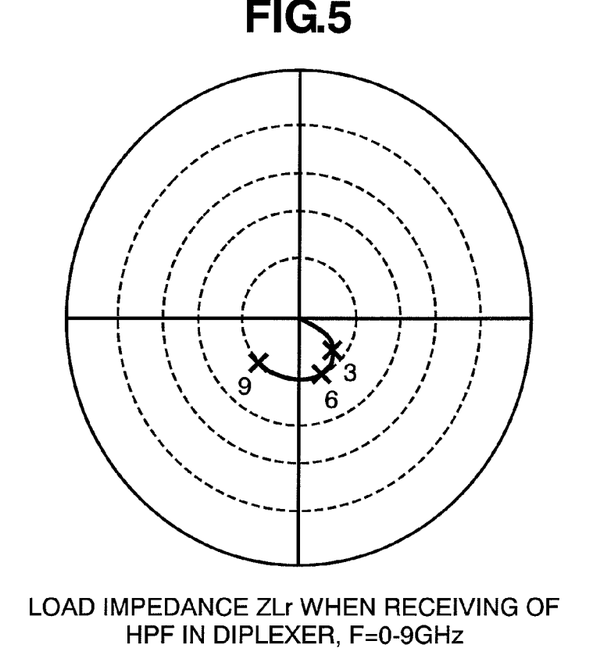
FIG. 5 is a graph for showing improved load impedance ZLr of HPF of the branching filter when receiving.

For this reason, the respective switches are tuned into, as follows:

| | |
|---|---|
| The band change-over switch 12: | L-side; |
| The band change-over switch 13: | H-side; |
| The impedance switch 16: | Conductive; and |
| The impedance switch 20; | Conductive. |

Wherein, the reactance element 19 change the input impedance of the LNA 21 in the frequency equal to 6 GHz or higher than that, so that the load impedance ZLr, e.g., the sum of the output impedance and the impedance of the wiring 18 come close to 50 Ω.

This improved load impedance ZLr is shown in FIG. 5. Because it operates in this manner, it is possible to realize the transmitting/receiving of the portable telephone of 80 MHz and transmitting/receiving of UWB, without enlarging the circuit scale or an increase of costs thereof.

Embodiment 2

Figure 6:
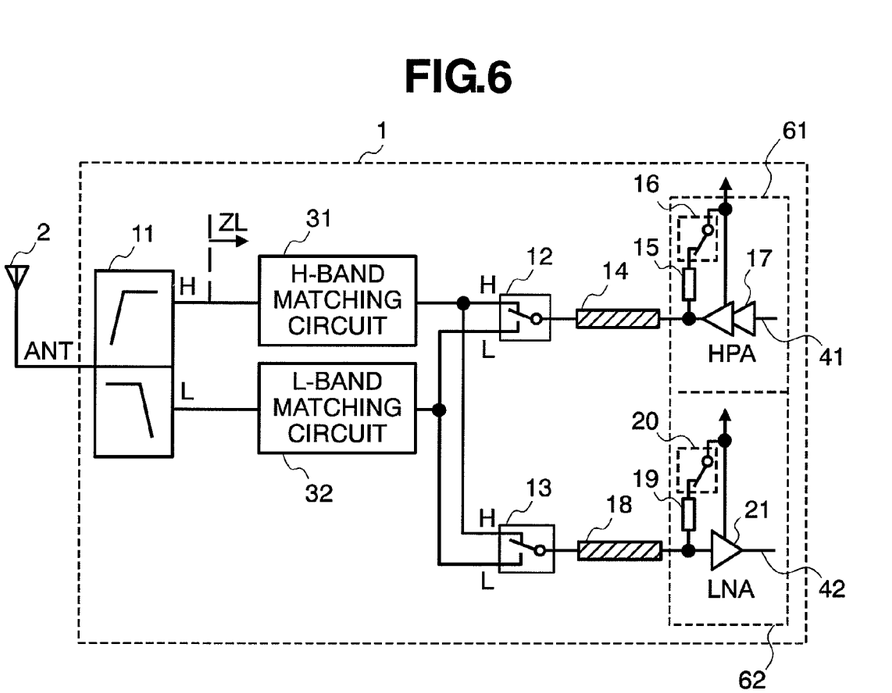
FIG. 6 shows a wireless receiver, according to an embodiment 2 of the present invention.

FIG. 6 shows the multi-mode wireless receiver, according to an embodiment 2 of the present invention. In this FIG. 6, comparing to that shown in FIG. 1, it differs from the embodiment 1 shown in FIG. 1, in that an impedance matching circuit 31 for the HPA of the diplexer 11 and an impedance matching circuit 32 for the LPF of the diplexer 11 are added, i.e., the impedance (shown by "ZL" in FIG. 6) when seeing the HPA 17 from the H terminal of the diplexer 11.

On the side of the H terminal of the HPF, an impedance can be matched to the pass-band, and in more details thereof, it can be achieved by means of a T-type matching circuit, a π-type matching circuit, or a L-type matching circuit.

The high power amplifier 17, the reactance element, and the switch 16 to be turned ON/OFF, so that the reactance element 15 gives an influence upon the output impedance of the HPA, are constructed as an unit, on a semiconductor integrated circuit 61, and the low noise amplifier 21, the reactance element 19, and switch 20 to be turned ON/OFF, so that the reactance element gives an influence upon the input impedance of the LNA, are constructed as an unit on the semiconductor integrated circuit 62. And, it is also possible to construct the semiconductor integrated circuit 61 and the semiconductor integrated circuit 62 as a unit.

Even in this instance, as was mentioned in the embodiment 1, within the frequency region equal to 6 GHz or higher than that when transmitting/receiving the UWB, the load impedance TZt comes off. For this reason, the load impedance TZt is made close to 50Ω, by turning the impedance switch 16 conductive.

In the operation when receiving the UWB, similar to the above, the load impedance ZLr is made come close to 50Ω, by turning the impedance switch 16 conductive.

Because of the operation in this manner, it is possible to conduct the transmitting/receiving of the UWB, with less loss of the high frequency signal.

Embodiment 3

Figure 7:
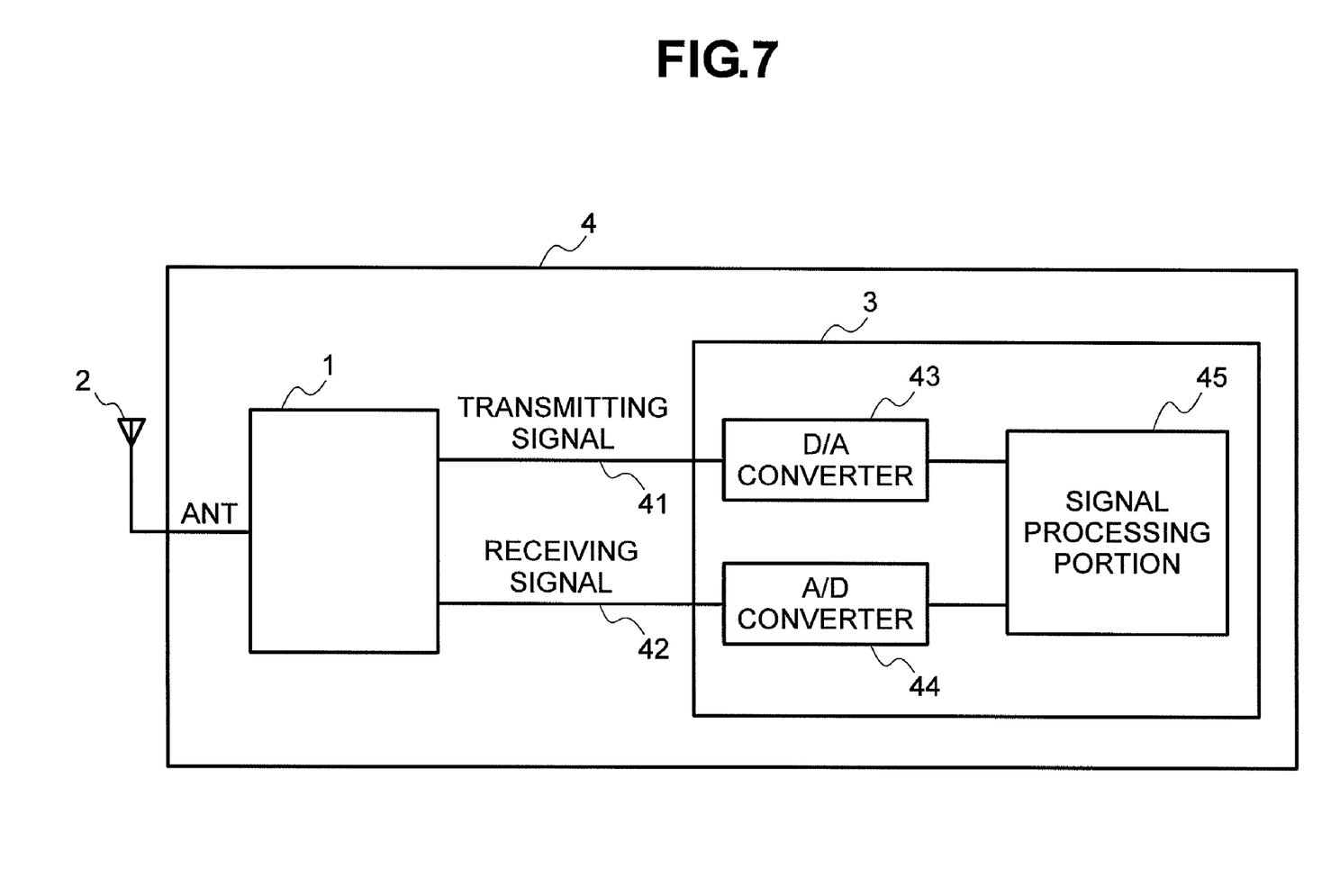
FIG. 7 shows a wireless receiver, according to an embodiment 2 of the present invention.

FIG. 7 shows a multi-mode wireless receiver, according to an embodiment 3 of the present invention. In this FIG. 7, the reference numeral 1 depicts the high-frequency transmitting portion of the first embodiment, but a reference numeral 3 depicts a software defined wireless signal processing portion, 4 a software defined wireless receiver, 43 a D/A converter, 41 a transmitting signal to be outputted by the D/A converter, 44 an A/D converter, 42 a receiving signal to be inputted into the A/D converter, and 45 a signal processing portion for conducting demodulation and/or enclosing/decoding therein.

The software defined wireless signal processing portion 3 conducts a software defined wireless signal process, which is proposed for achieving the wireless systems, differing in the frequency band, the multiplex accessing method, the signal Duplexing method, the modulation/demodulation method, the encoding/decoding method, such as, the portable telephones method and the wireless LAN method, but by means of the same hardware. (It is also called by "reconfigurable wireless method".)

In more details, the signal processing portion 45 produces a transmitting digital signal corresponding to various kinds of methods, and the D/A converting portion 43 converts it into an analog signal, whereby it is transmitted from the high-frequency transmitting portion 1 to the antenna 2. The receiving signal from the antenna 2 is outputted from the high-frequency transmitting portion 1, to be converted into a digital signal within the A/D converter 44, and it is demodulated and decoded within the signal processing portion 45.

The software wireless receiver 4, since it conducts first the transmitting/receiving of the portable telephone of GSM method, the receiving signal from the high-frequency transmitting portion 1 is converted into the digital one, and the signal processing portion 45 makes GMSK demodulation, for processing thereof.

Next, when transmitting, by controlling the respective switches of the high-frequency transmitting portion 1, as was mentioned in the embodiment 1, the signal processing portion 45 outputs the GMSK demodulated digital signal in the time-division manner, so as to transmit it from the high-frequency transmitting portion 1. In this manner, the transmitting/receiving is conducted for the GSM method of portable telephone.

Next, in case when shifting into the transmitting/receiving of the UWB method, similar to that of the embodiment 1, the high-frequency transmitting portion 1 is controlled, so that the receiving signal 42 outputted is A/D converted at a speed corresponding to the MC-OFDM, and thereby decoding the data through dissolving the Orthogonal Frequency Division Multiplexing.

When transmitting, the respective switches of the high-frequency transmitting portion 1, as was mentioned in the embodiment 1, so that the signal processing portion 45 outputs a digital signal orthogonal frequency multiplexed, and the signal is D/A converted to be transmitted from the high-frequency transmitting portion 1.

In this manner, for the multi-mode wireless receiver according to the present invention, irrespective of the software wireless method thereof, it is possible to achieve the multi-mode transmitting/receiving.

Embodiment 4

Figure 8:
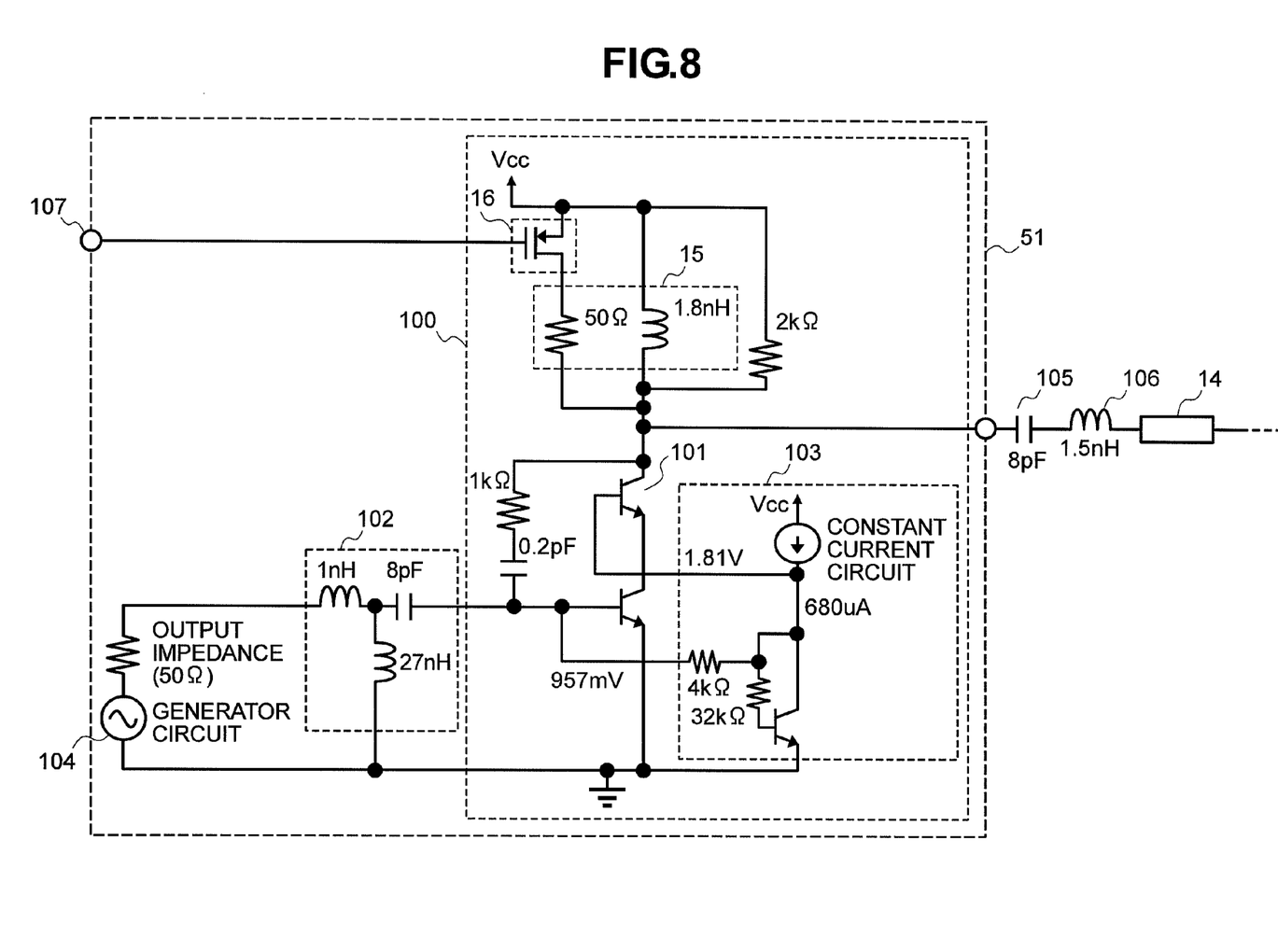
FIG. 8 shows a transmitting amplifier, according to an embodiment 2 of the present invention.

FIG. 8 attached herewith shows a transmitting amplifier 100, according to an embodiment 4 of the present invention. As is shown in the figure, the transmitting amplifier 100 is a part of the semiconductor integrated circuit 51. In this FIG. 8, a reference numeral 16 depicts an impedance switch, which is made up with a PMOS transistor, 15 a reactance element, 101 a NPN transistor, 103 a bias-voltage generator circuit, 104 a generator circuit for outputting a signal to the transmitting amplifier 100, and 107 an input terminal for exchanging an impedance.

Thus, the transmitting amplifier 100 is built up with those mentioned above, as well as, resistors, inductances and capacitors, etc., shown in the figure. Also, the semiconductor integrated circuit 51 is mounted on the printed circuit board 11, and it is connected with the wiring through impedance matching element 105 and 106.

The transmitting amplifier 100 conducts the UWB transmitting when voltage at the intemperance exchanging input terminal 107=Vcc (for example, 2.8 V), while it conducts the transmitting of the GSM method portable telephone signal when that voltage at the intemperance exchanging input terminal 107 is zero (=0).

Explaining the operation of this exchanging, when the voltage at 107=2.8 V, the PMOS transistor, e.g., the impedance switch 16 is turned OFF, and then the NPN transistor 101 conducts an amplifying operation, with taking a load of inductance 1.8 nH of the reactance element 15. On the other hand, when the voltage at 107=0 V, the impedance switch 16 is turned ON, and then NPN transistor 101 conducts the amplifying operation, with taking a load of 50Ω, in addition to the load of inductance 1.8 nH of the reactance element.

The characteristics of the transmitting amplifier 100, operating in this manner in the frequency 4,600 MHz (i.e., the UWB signal) and 900 MHz (i.e., the portable telephone signal) are shown in the Table below:

TABLE 2

| Mode | UWB | | Portable Telephone | |
|---|---|---|---|---|
| Voltage at 107 | 0.0 [V] | | 2.8 [V] | |
| Frequency | 4,600 [MHz] | 900 [MHz] | 4,600 [MHz] | 900 [MHz] |
| Gain | 11.0 [dB] | 9.6 [dB] | 2.4 [dB] | 11.1 [dB] |
| Output VSWR | 1.38 | 5.50 | 3.43 | 3.01 |

In this manner, when it is in the UWB mode, since a gain at the frequency 4,600 MHz is larger than that at the frequency 900 MHz, and an output VSWR at the frequency 4,600 MHz is smaller than that at the frequency 900 MHz, i.e., reflection is less, therefore it is suitable for the UWB transmitting.

On the other hand, when it is in the portable telephone mode, since the gain at the frequency 900 MHz is larger than that at the frequency 4,600 MHz, and the VSWR at the frequency 900 MHz is smaller than that at the frequency 4,600 MHz, therefore it is suitable for the transmitting of the portable telephone signal.

With building up the transmitting amplifier 100 in such the manner as mentioned above, it is possible to obtain the multi-mode wireless receiver, enabling to conduct both the UWB transmitting and the portable telephone transmitting, with preferable characteristics thereof.

The present invention can be applied into the high-frequency circuit portion within the multi-band or multi-mode compound wireless receiver, being operable with the different wireless systems with using a plural number of frequency bands, such as, the terminal device compounding the portable telephone apparatus of 800 MHz band and the UWM of 9 GHz band, for example. In more details thereof, the high-frequency circuit portion is the printed circuit board of the high-frequency circuit, or the high-frequency wave transmitting portion, or the high-frequency wave receiving portion.

According to the present invention, it is possible to achieve the wireless receiver, but without causing remarkable deterioration on the high-frequency transmitting/receiving characteristics, even if changing the frequency specification from the 800 MHz band to the 10 GHz band.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. A wireless transmitting/receiving apparatus, formed on a printed circuit board, comprising:
    a high pass filter;
    a low pass filter;
    a transmitting power amplifier;
    a low noise amplifier;
    a transmitting change-over means, which is connected with said high pass filter, said low pass filter, and said transmitting power amplifier;
    a receiving change-over means, which is connected with said high pass filter, said low pass filter, and said low noise amplifier;
    a transmitting wire on said printed circuit board, which connects output terminals of said transmitting change-over means and said transmitting power amplifier;
    a transmitting resistor or a transmitting reactance element, or a transmitting element composed thereof, which is connected with the terminal of said transmitting power amplifier and is able to change an impedance of said transmitting wire;
    a receiving wire on said printed circuit board, which connects said receiving change-over means and an input terminal of said low noise amplifier;
    a receiving resistor, a receiving reactance element or a receiving element composed thereof, which is connected with the input of said low noise amplifier and is able to change an impedance of said receiving wire; and
    a switching means for turning ON/OFF of connection between the transmitting resistor or the transmitting reactance element, or the transmitting element composed thereof, and the output terminal of said transmitting power amplifier, responding to a signal for changing over between said high pass filter and said low pass filter, and for turning ON/OFF of connection between the receiving resistor or the receiving reactance element, or the receiving element composed thereof, and the input terminal of said low noise amplifier, responding to the signal for changing over between said high pass filter and said low pass filter.

2. The wireless transmitting/receiving apparatus, as described in the claim 1, further comprising a D/A converter for inputting an analog signal to said transmitting power amplifier, an A/D converter for digital converting an output of said low noise amplifier, and a signal processing portion for conducting a signal processing including one or more of modulation/demodulation, encoding/decoding and generation of a sampling clock.

* * * * *